United States Patent [19]
Motonami

[11] Patent Number: 5,441,916
[45] Date of Patent: Aug. 15, 1995

[54] METHOD OF MANUFACTURING SEMICONDUCTOR DEVICE COMPRISING INTERCONNECTION

[75] Inventor: Kaoru Motonami, Hyogo, Japan

[73] Assignee: Mitsubishi Denki Kabushiki Kaisha, Tokyo, Japan

[21] Appl. No.: 234,806

[22] Filed: Apr. 28, 1994

Related U.S. Application Data

[62] Division of Ser. No. 875,185, Apr. 28, 1992, Pat. No. 5,323,049.

[30] Foreign Application Priority Data

May 10, 1991 [JP] Japan .................. 3-105719

[51] Int. Cl.⁶ .................. H01L 21/283; H01L 21/312
[52] U.S. Cl. .................. 437/195; 437/52; 437/187; 437/229
[58] Field of Search .................. 437/195, 52, 229, 187, 437/228

[56] References Cited

U.S. PATENT DOCUMENTS

| | | | |
|---|---|---|---|
| 4,317,276 | 3/1982 | Heeren et al. | 437/41 |
| 4,879,257 | 11/1989 | Patrick | 437/195 |
| 4,977,102 | 12/1990 | Ema | 437/52 |
| 5,091,761 | 2/1992 | Hiraiwa et al. | |
| 5,135,891 | 8/1992 | Ikeno et al. | 437/228 |
| 5,177,575 | 1/1993 | Ikeda | |
| 5,196,910 | 3/1993 | Moriuchi et al. | |
| 5,258,329 | 11/1993 | Shibata | 437/195 |

FOREIGN PATENT DOCUMENTS 0423814 4/1991 European Pat. Off. .
4034169A1 5/1991 Germany .

*Primary Examiner*—T. N. Quach
*Attorney, Agent, or Firm*—Lowe, Price, LeBlanc & Becker

[57] ABSTRACT

In a semiconductor device, a first conductive interconnection layer and a second conductive interconnection layer are formed respectively on a lower surface and a higher surface of an interlayer insulation film interposing a step-like portion therebetween by employing different photolithography and etching. A dummy interconnection is provided directly beneath the second conductive interconnection layer in the vicinity of the step-like portion. The first and second conductive interconnection layers and are electrically connected to each other by a conductive layer formed directly on the dummy interconnection in a region including the step-like portion to extend over the surface of a silicon substrate. Consequently, even if the step-like portion is larger than depth of focus, the first and second conductive interconnection layers are precisely patterned within depth of focus.

6 Claims, 12 Drawing Sheets

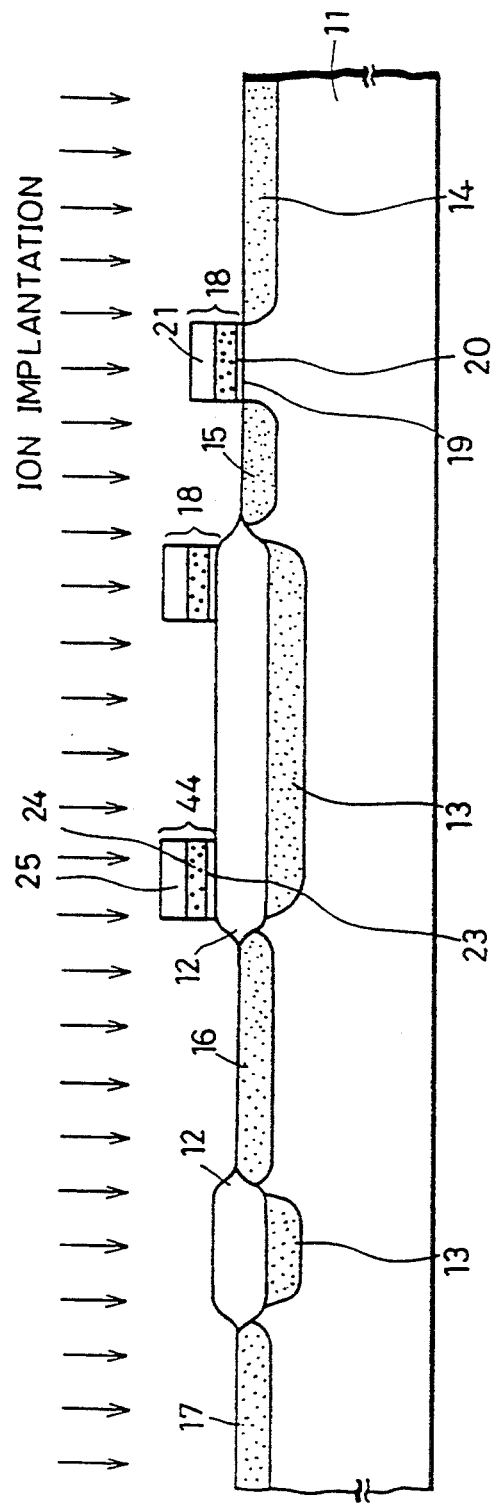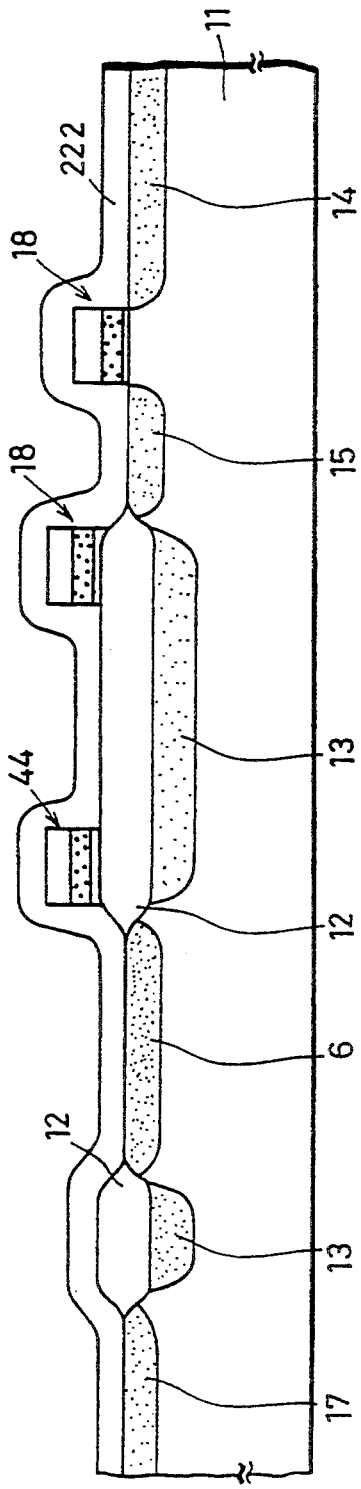

METHOD OF MANUFACTURING SEMICONDUCTOR DEVICE COMPRISING INTERCONNECTION

This application is a division of application Ser. No. 07/875,185 filed Apr. 28, 1992 U.S. Pat. No. 5,323,049.

BACKGROUND OF THE INVENTION

1. Field of the Invention

The present invention relates generally to semiconductor device and manufacturing methods thereof and, more particularly, to a technique for formation of a desired conductive interconnection pattern without being affected by step-like portions formed in an interlayer insulation film.

2. Description of the Background Art

Mostly, an integrated circuit (hereinafter referred to as "IC") memory such as a DRAM (Dynamic Random Access Memory) is comprised of a memory cell array including a large number of storage elements and a peripheral circuit necessary for input/output, and the memory cell array and the peripheral circuit are formed on the same substrate.

FIG. 12 is a block diagram showing one example of structure of a general DRAM. With reference to FIG. 12, a memory cell array 1 includes a plurality of word lines and a plurality of bit lines arranged to cross over each other therein. Memory cells are provided at respective cross-over points of the word lines and the bit lines. Each of the memory cells is selected by selecting a corresponding one of the word lines by an X address buffer decoder 2 and a corresponding one of the bit lines by a Y address buffer decoder 3. Data is written into a selected one of the memory cells, or data stored in the selected memory cell is read. Instruction of such data writing/reading is made by a read/write control signal (R/W) which can be applied by a R/W control circuit 4. In data writing, input data (Din) is applied as an input to the selected memory cell via R/W control circuit 4. In data reading, data stored in the selected memory cell is detected and then amplified by a sense amplifier 5. The amplified data is output as output data (Dout) via a data output buffer 6 to the outside.

FIG. 13 is an equivalent circuit diagram of a dynamic type memory cell for use in explaining a writing/reading operation of the memory cell.

Referring to FIG. 13, the dynamic type memory cell includes a set of field effect transistor 7 and capacitor 8. A gate electrode of field effect transistor 7 is connected to a word line 9. A source/drain electrode of field effect transistor 7 connected to capacitor 8 is connected to a bit line 10. A predetermined potential is applied to word line 9 in data writing. This renders field effect transistor 7 conductive, so that charges applied to bit line 10 are stored in capacitor 8. In data reading, a predetermined potential is applied to word line 9. This renders transistor 7 conductive, so that the charges stored in capacitor 8 are extracted via bit line 10.

A description will now be made on one example of structure of a conventional IC memory with reference to FIGS. 11A and 11B. FIG. 11A is a cross-sectional view showing a part of a conventional memory cell array 102 and peripheral circuitry 101, and FIG. 11B is a plan lay-out of the corresponding part. Here, a stacked capacitor is shown as an example of a capacitor of a memory cell.

In this memory cell, with reference to FIGS. 11A and 11B, a field effect transistor 18 is formed on a silicon substrate 11. Field effect transistor 18 includes a gate oxide film 19, a gate electrode 20, an overlying insulator film 21 and a sidewall insulator film 22. While gate electrode 20 is not shown in the figures due to structure of the memory cell array, the gate electrode is disposed also on a field oxide film 12 for isolation. A diffusion layer 13 for reinforcing isolation is formed beneath field oxide film 12. Also, diffusion layers 14 and 15 serving as a source/drain region of field effect transistor 18 are formed.

As the one corresponding to capacitor 8 of FIG. 13, a capacitor including a storage node 29, a capacitor insulation film 31 and a cell plate 32 is formed. This capacitor is electrically connected through a contract hole 27 to the aforementioned diffusion layer 15. As the one corresponding to bit line 10 of FIG. 13, a bit line 40 is formed. This bit line 40 now has polycide structure formed of a polycrystalline silicon layer 38 and a tungsten silicide layer 39. This bit line 40 is electrically connected through a contact hole 34 to the aforementioned diffusion layer 14. A diffusion layer 17 is formed in a peripheral circuit 102 and electrically connected through a contact hole 37 to bit line 40. Insulation between the capacitor and bit line 40 is achieved by an interlayer insulation film 33.

At present, IC memories employ the above-described stacked capacitors in order to increase integration density and capacitance. Thus, there arises a problem with respect to step-like portions due to a difference in height between a portion on an IC chip where a capacitor is disposed and a portion where no capacitor is disposed. Particularly, in a case where bit line 40 is formed in an upper portion of the capacitor as shown in the foregoing conventional example, if depth of focus in resist pattern formation is smaller than the above-described step-like portions in photolithography using a photoresist mask for use in formation of bit line 40, it has been very difficult to precisely process all bit lines 40 on chip to a desired dimension in comply with the photoresist mask.

SUMMARY OF THE INVENTION

An object of the present invention is to provide a structure of and a manufacturing method of a semiconductor device in which when a conductive interconnection is formed on an interlayer insulation film having a step-like portion, a desired conductive interconnection pattern can be formed without being affected by the step-like portion.

A semiconductor device of the present invention accomplishing the foregoing object includes: an interlayer insulation film formed on a substrate and having a step-like portion; a first conductive interconnection layer formed in a lower surface of both surfaces interposing the step-like portion therebetween on the interlayer insulation film; a second conductive interconnection layer formed in a higher surface of the both surfaces; a dummy interconnection provided directly beneath the second conductive interconnection layer in the vicinity of the step-like portion, having approximately the same height as that of the step-like portion in the interlayer insulation film and not serving as a conductive interconnection per se; a conductive layer formed directly on the dummy interconnection and extending to substrate surface in a region including the step-like portion; and so on. The first conductive interconnection layer is electrically connected through a contact hole provided in the interlayer insulation film to a portion of the conductive layer located in the substrate surface. The second conductive interconnection layer is electrically connected through a contact hole provided in the interlayer insulation film to a portion of the conductive layer located directly on the dummy interconnection.

In accordance with the semiconductor device thus structured, since the conductive interconnection layer is not successively formed in the step-like portion of the interlayer insulation film, disconnection of the conductive interconnection or the like which is liable to occur in patterning of the step-like portion is prevented.

A method of manufacturing a semiconductor device according to the present invention includes the steps of: forming an interlayer insulation film having a step-like portion on a substrate; depositing a conductive film on the surface of the interlayer insulation film; and patterning the conductive film and forming a first conductive interconnection layer in a lower surface of both surfaces of the interlayer insulation film interposing the step-like portion therebetween and a second conductive interconnection layer in a higher surface of the both surfaces. The first and second conductive interconnection layer forming step includes the steps of: forming a photoresist mask having a pattern covering all regions where the second conductive interconnection layer is to be formed, in addition to the same pattern as that of the first conductive interconnection layer, and carrying out etching by using the photoresist mask as a mask; and forming a photoresist mask having a pattern covering all regions where the first conductive interconnection layer is to be formed, in addition to the same pattern as that of the second conductive interconnection layer, and carrying out etching by using the photoresist mask as a mask.

In accordance with the manufacturing method including the above steps, when the conductive interconnection layer is formed on the interlayer insulation film having a step-like portion, the conductive interconnection layer is divided into a lower surface and a higher surface of the interlayer insulation film with the step-like portion interposed therebetween, and etching is carried out by patterning the photoresist mask for each region of each height. Accordingly, even if depth of focus in resist pattern formation is smaller than the step-like portion of the interlayer insulation film, a conductive interconnection layer of a desired shape and size in comply with the pattern of the photoresist mask can be obtained for each region of each height.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A-2B, 3A, 3B, 4A, 4B, 5A, 5B, 6A, 6B, 7A and 7B are cross-sectional views showing in turn the steps of a method of manufacturing a semiconductor device according to the first embodiment of the present invention.

DESCRIPTION OF THE PREFERRED EMBODIMENTS

Figure 1A:
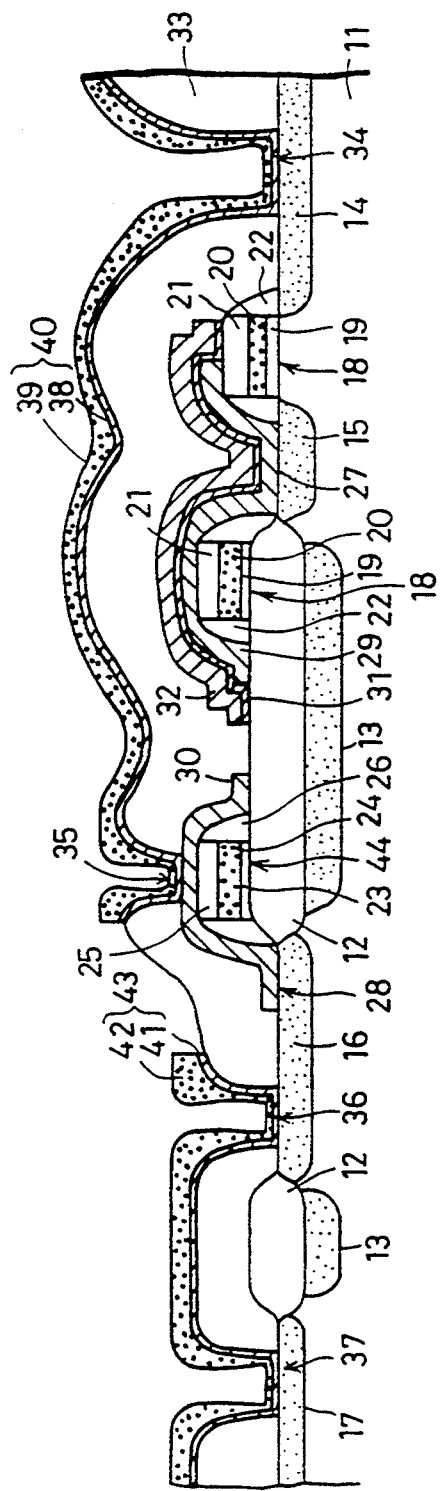
FIG. 1A is a cross-sectional view showing structure of a semiconductor device of a first embodiment of the present invention.
Figure 1B:
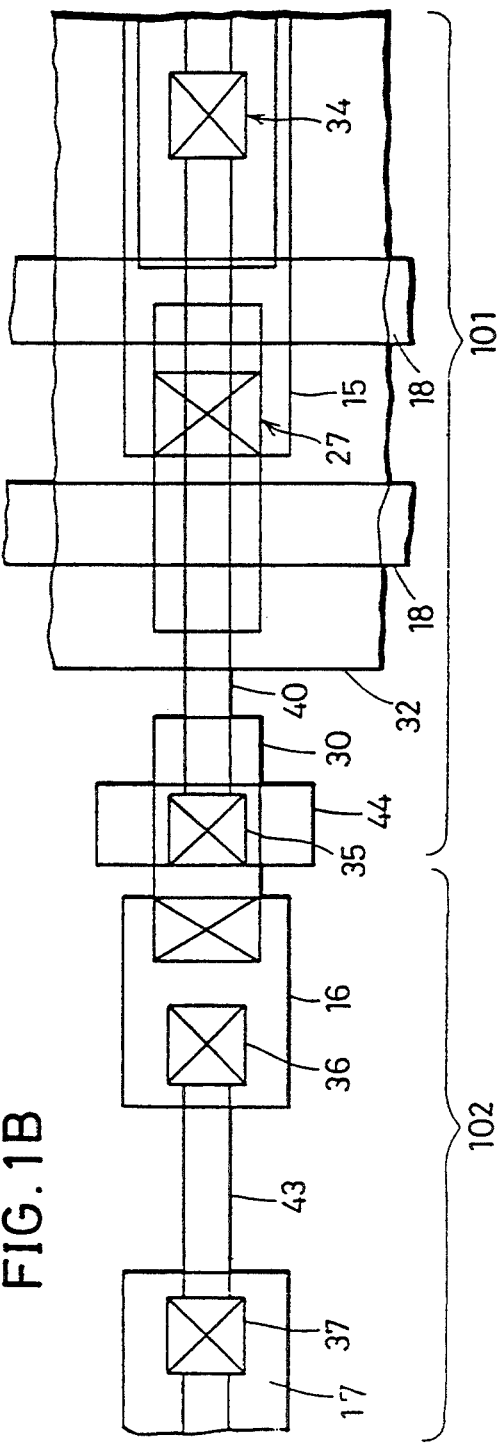
FIG. 1B is a plan view showing a lay-out of FIG. 1A.

A description will now be made on structure of a semiconductor device of a first embodiment of the present invention with reference to FIGS. 1A and 1B.

The semiconductor apparatus of the present embodiment is an embodiment in which the present invention is applied to a DRAM. In this semiconductor device, a field oxide film 12 for isolation is formed in a surface of a p type silicon substrate 11. A p type diffusion layer 13 for reinforcing isolation is provided in contact with a lower surface of field oxide film 12. In the surface of silicon substrate 11 isolated by field oxide film 12 are formed a diffusion layer being a source/drain region of a MOS field effect transistor of a memory cell, a diffusion layer 17 of a peripheral circuit and a conductive diffusion layer 16. The MOS field effect transistor has a gate 18 including a gate oxide film 19, a gate electrode 20 and an overlying insulation film. A sidewall insulation film 22 is formed on each of opposite sidewalls of gate 18. Gate 18 is also formed on field oxide film 12. On field oxide film 12 is formed a dummy interconnection 44 including an oxide film 23, a polycrystalline silicon layer 24 and an overlying insulation film 25. A sidewall insulation film 26 is formed on sidewalls of dummy interconnection 44.

A capacitor of the memory cell is formed to extend over both adjacent gates 18. This capacitor comprises a storage node 29 electrically connected to a diffusion layer 15 in a contact 27, a capacitor insulation film 31 formed to cover the surface of storage node 29, and a cell plate 32 formed to cover capacitor insulation film 31.

A conductive polycrystalline silicon layer 30 is formed on dummy interconnection 44 and sidewall insulation film 26. This conductive polycrystalline silicon layer 30 is connected to conductive diffusion layer 16 in a contact 28.

Further, an interlayer insulation film 33 is formed over the entire surface of silicon substrate 11. Contact holes 34, 35, 36 and 37 are provided in interlayer insulation film 33. In the surface of interlayer insulation film 33 are formed a bit line 40 formed of a polycrystalline silicon layer 38 and a tungsten silicide layer 39, and a bit line 43 formed of a polycrystalline silicon layer 41 and a tungsten silicide layer 42. Bit line 40 is connected to a diffusion layer 14 in contact hole 34 and to conductive polycrystalline silicon layer 30 in contact hole 35. Bit line 43 is connected to conductive diffusion layer 16 in contact hole 36 and diffusion layer 17 in contact hole 37.

In accordance with the semiconductor device of this embodiment thus structured, bit lines 40 and 43 are separated from each other to interpose the step-like portion of interlayer insulation film 33 therebetween, and those bit lines are connected with each other through contact holes 35 and 36 formed in interlayer insulation film 33 and through conductive polycrystalline silicon layer 30 below interlayer insulation film 33 and conductive diffusion layer 16. Thus, it is unnecessary to successively form the bit lines in the step portion, thereby eliminating such a disadvantage as disconnection of the bit lines which is liable to occur in patterning of the step portion.

Figure 2A:
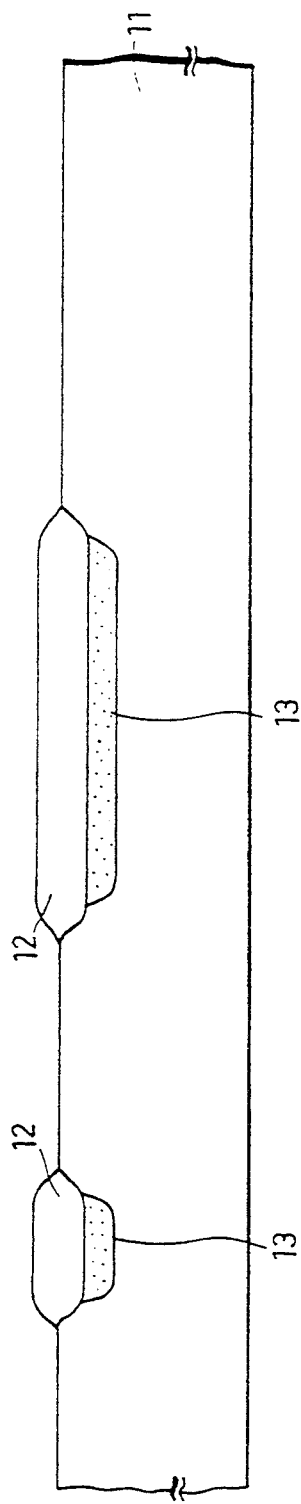
Figure 2B:
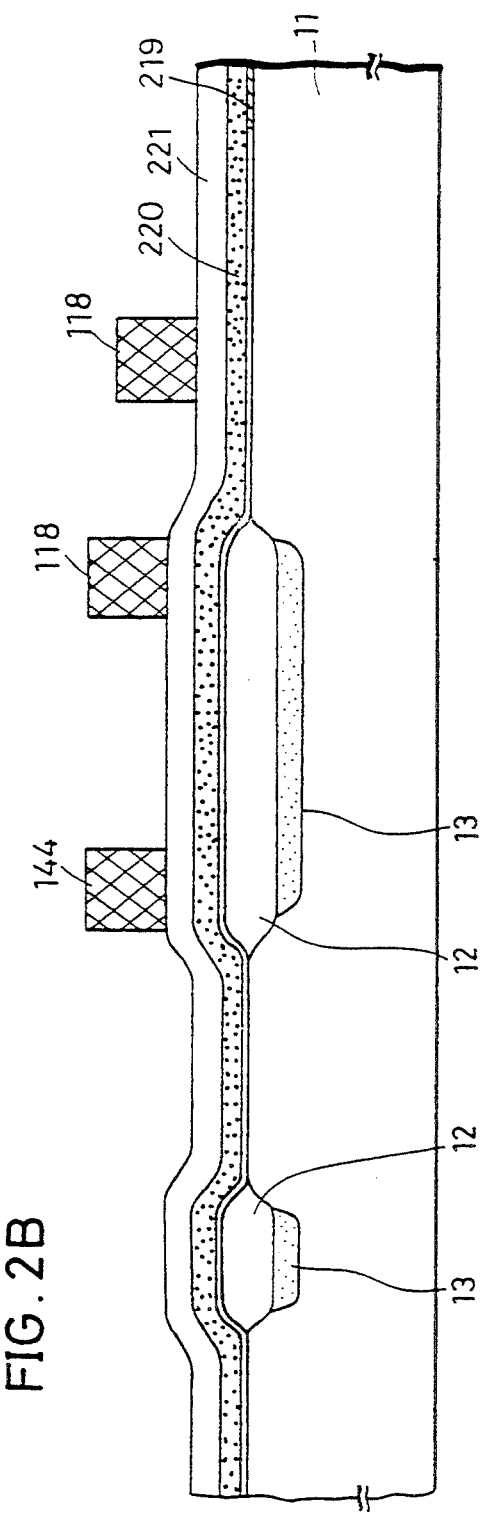

A manufacturing method of this embodiment will now be described with reference to FIGS. 2A-8B. Referring first to FIG. 2A, a field oxide film 12 for isolation is formed in a p type silicon substrate 11 by employing a so-called LOCOS (Local Oxidation of Silicon) method, and a diffusion layer 13 for reinforcing isolation is formed by implantation of boron ions. Referring then to FIG. 2B, a gate oxide film layer 219, a gate electrode layer 220 and an overlying insulation film layer 221 are formed, respectively. After that, in order to carry out a photolithography processing using a photoresist mask, a photoresist pattern 118 for forming a gate 18 of a field effect transistor and a photoresist pattern 144 for forming a dummy interconnection are formed. Thus, as shown in FIG. 3A, gate 18 of the field effect transistor and dummy interconnection 44 are formed at the same time by selective etching. Then, in silicon substrate 11 are formed diffusion layers 14 and 15 constituting a source/drain region of the field effect transistor, a diffusion layer 17 of peripheral circuitry and a conductive diffusion layer 16 by ion implantation.

Figure 4A:
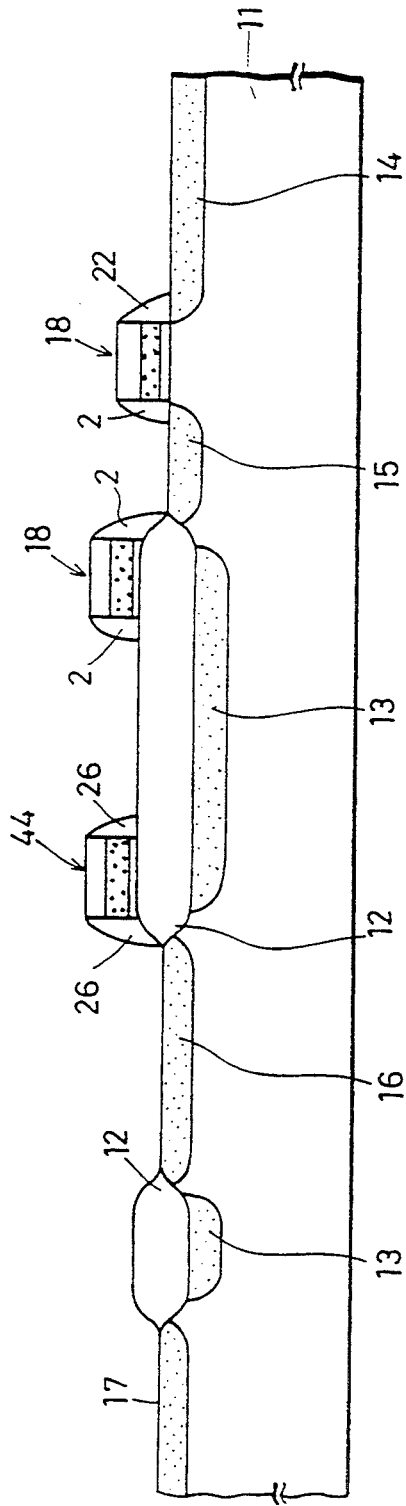
Figure 4B:
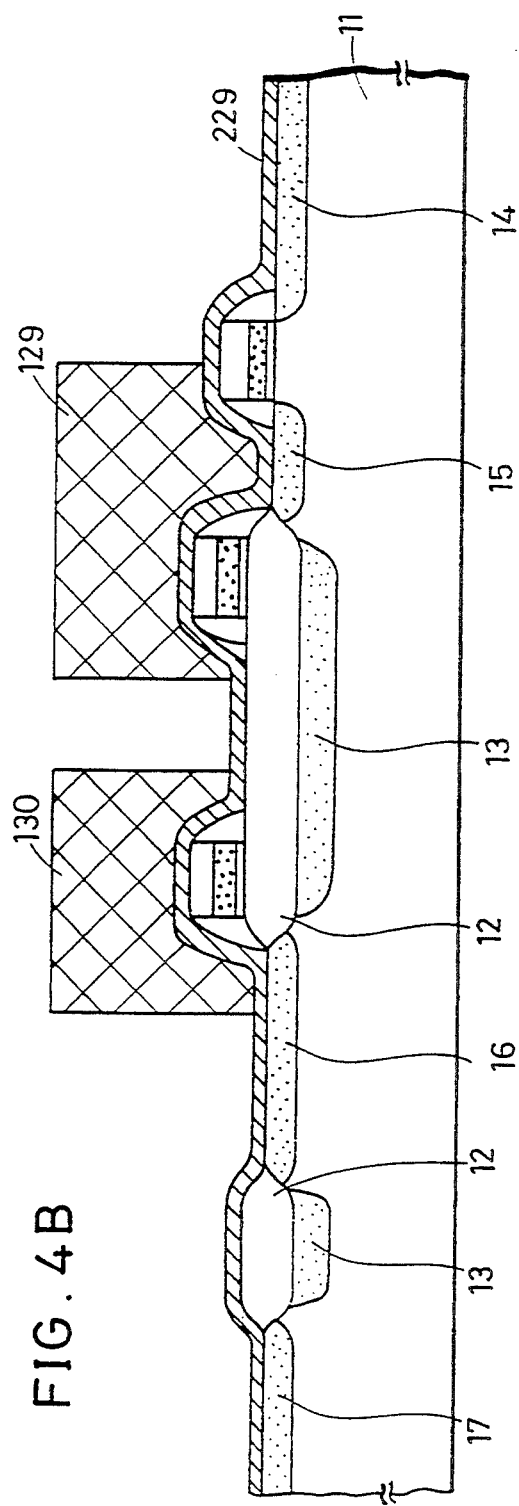

As shown in FIG. 3B, an insulation film layer 222 is formed by deposition of SiO₂ by employing e.g., a CVD (Chemical Vapor Deposition) method. A sidewall insulation film 22 and a dummy interconnection sidewall insulation film 26 as shown in FIG. 4A are formed by subjecting the entire surface of insulation film layer 222 to anisotropical etching. Then, as shown in FIG. 4B, a storage node layer 229 corresponding to a lower electrode of a capacitor is formed, and a photoresist pattern 129 for formation of a storage node 29 and a photoresist pattern 130 for formation of a conductive polycrystalline silicon layer 30 (see FIG. 5A) are formed. Accordingly, referring to FIG. 5A, storage node 29 and conductive polycrystalline silicon layer 30 are formed by selective etching.

Figure 5A:
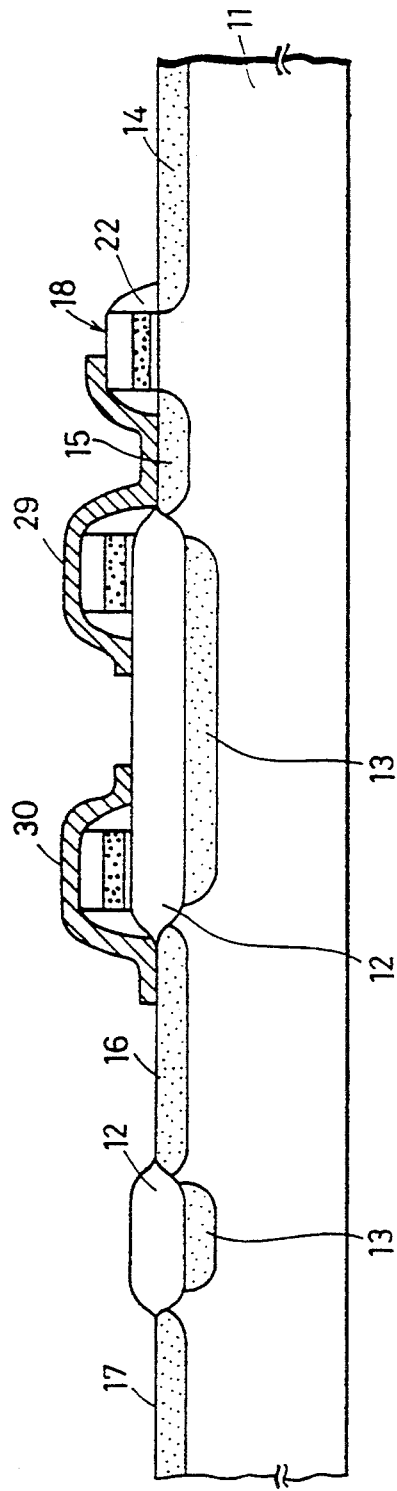
Figure 5B:
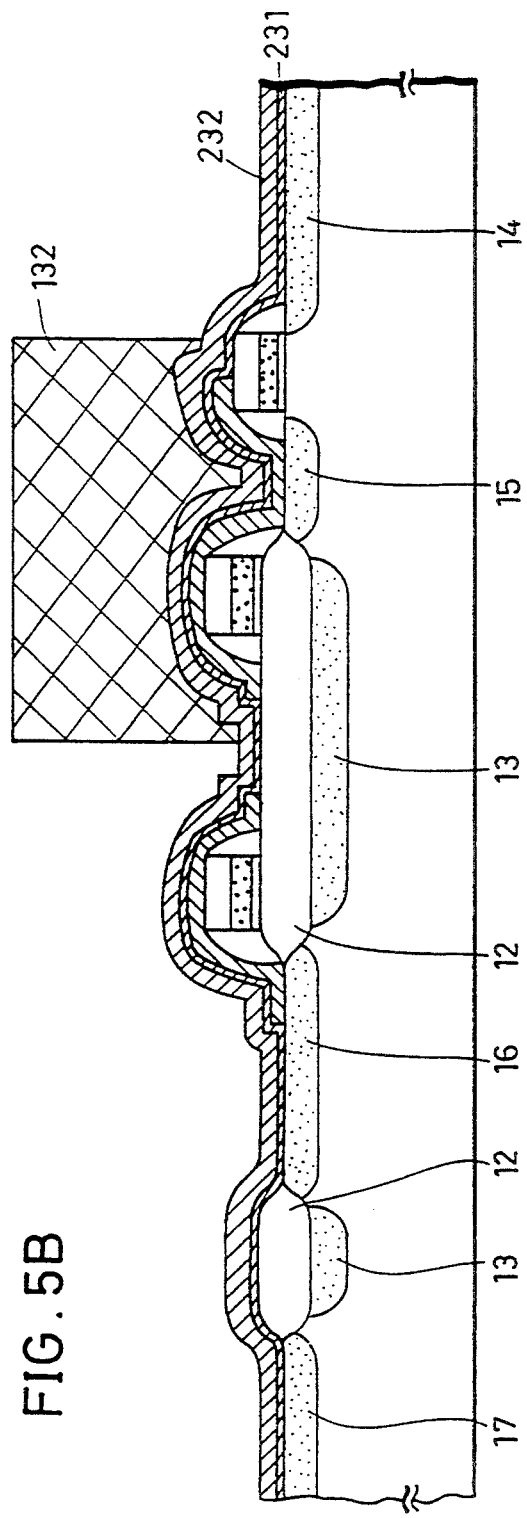
Figure 6A:
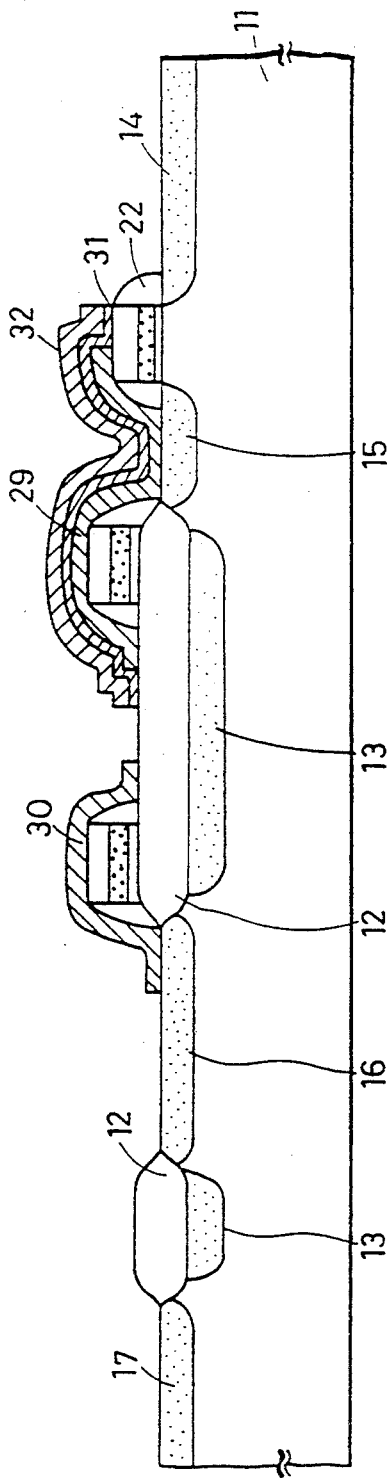

Then, as shown in FIG. 5B, a capacitor insulation film layer 231 and a cell plate layer 232 corresponding to an upper electrode of the capacitor are formed. After that, a photoresist pattern 132 is further formed, and a capacitor insulation film 31 and a cell plate 32 are formed by selective etching as shown in FIG. 6A. Thus, conductive polycrystalline silicon layer 30 remains unremoved.

Figure 6B:
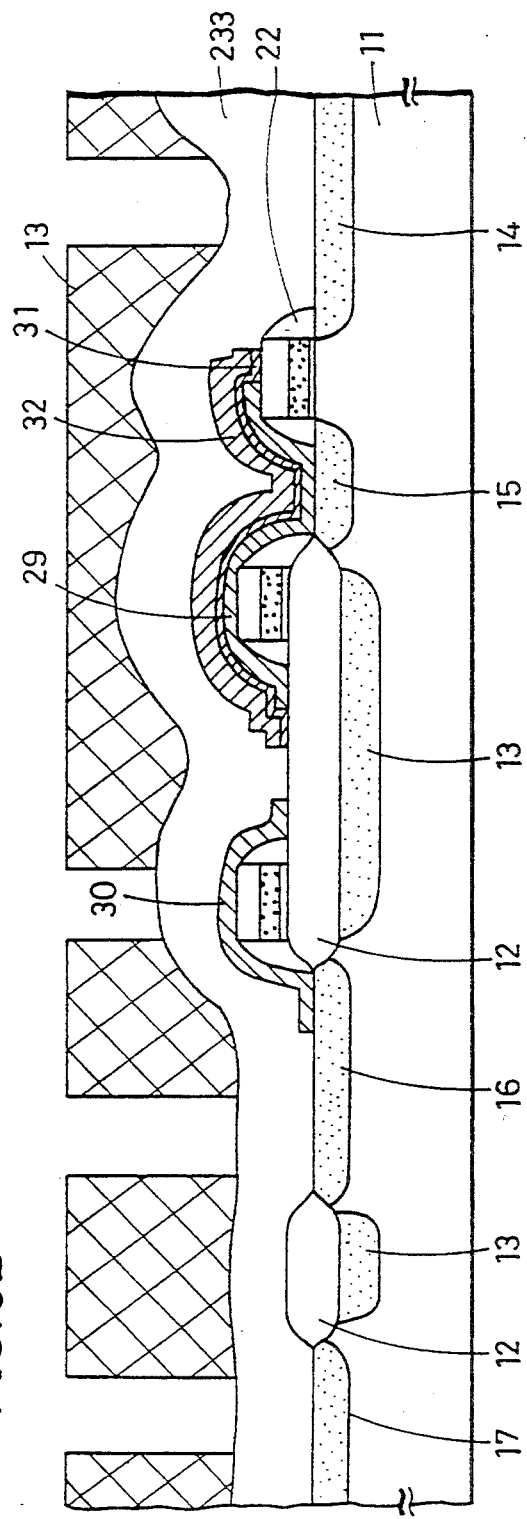
Figure 7A:
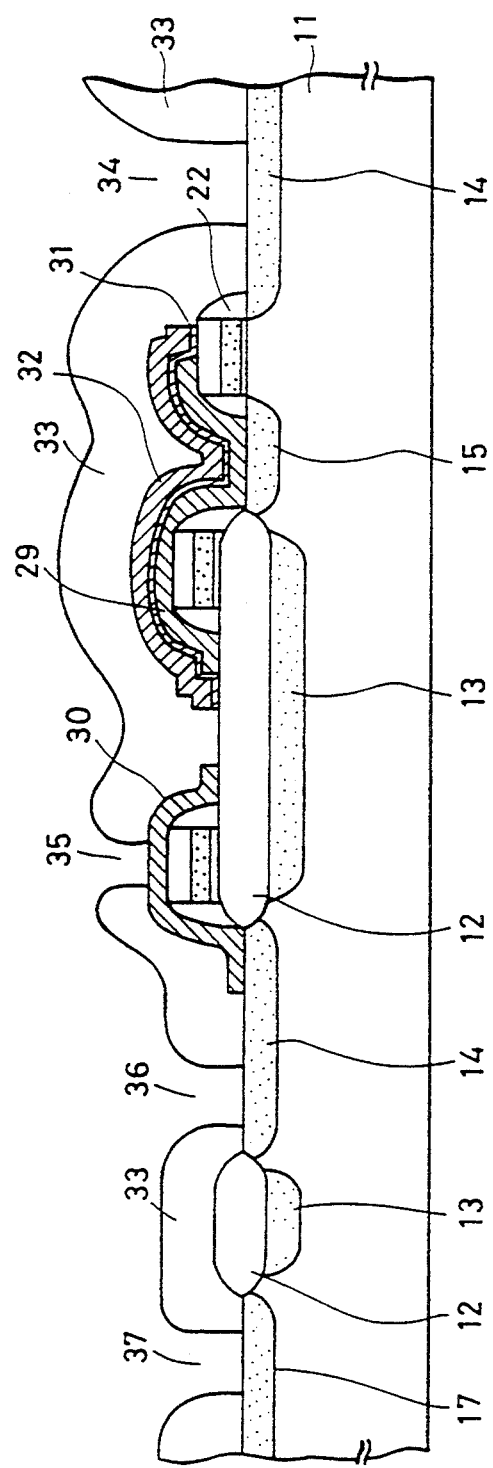
Figure 7B:
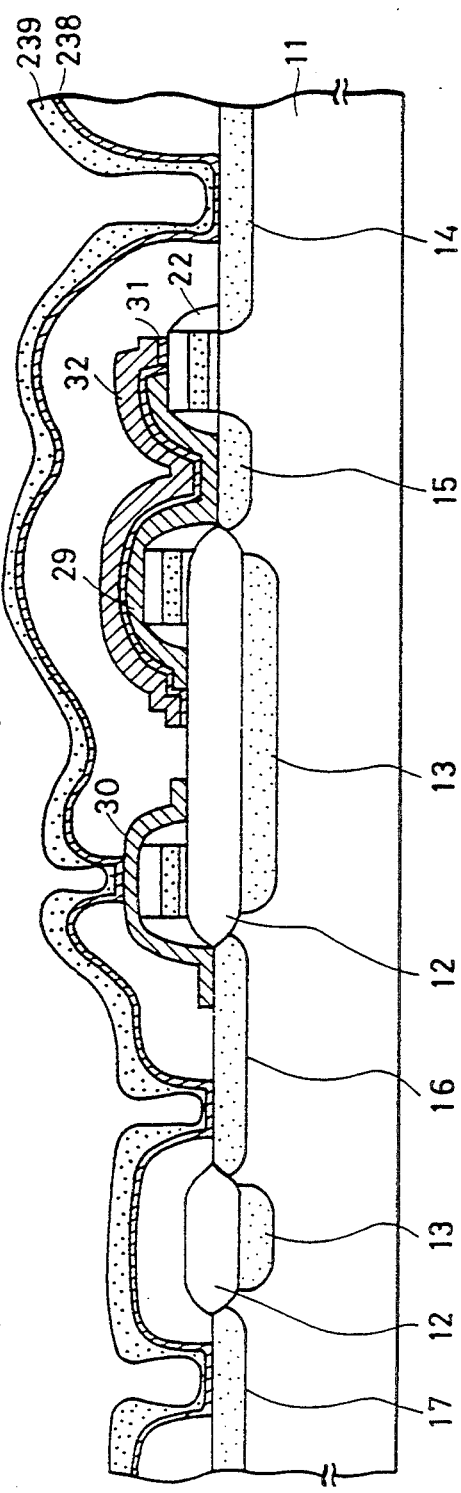

Referring then to FIG. 6B, an interlayer insulation layer 233 is formed, and a photoresist pattern 134 having an opening portion where a contact hole is to be formed is formed. Then, as shown in FIG. 7A, an interlayer insulation film 33 having contact holes 34, 35, 36 and 37 formed therein is formed by selective etching. After that, referring to FIG. 7B, a polycrystalline silicon layer 238 and a tungsten silicide layer 239 are formed to form bit lines over the entire surface. The formation of tungsten silicide layer 239 is carried out by first forming a tungsten layer on polycrystalline silicon layer 238 by sputtering or the like and then subjecting the tungsten layer to heat treatment and silicidation.

Figure 8A:
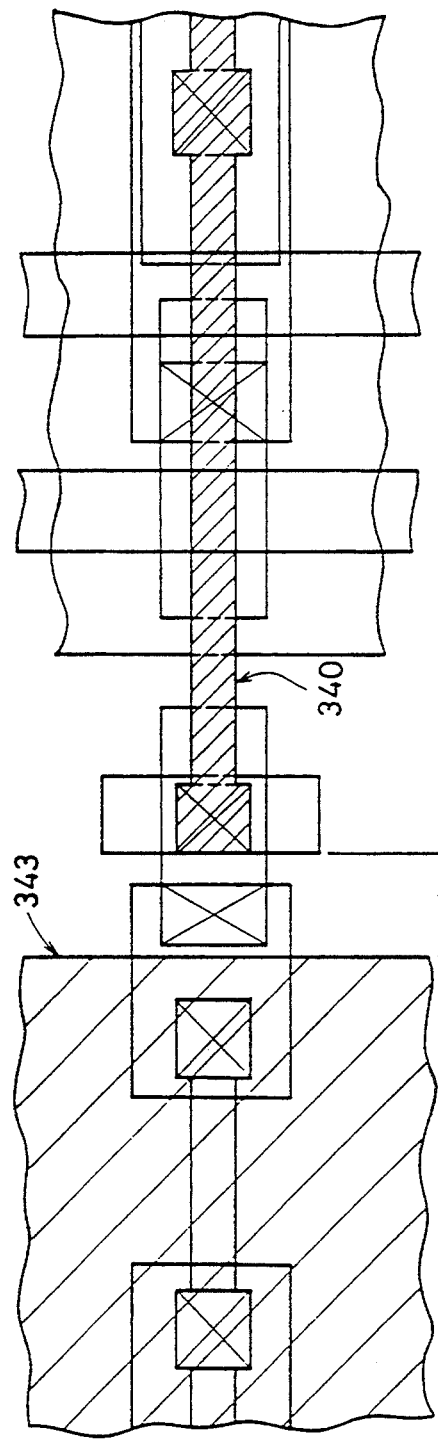
FIGS. 8A and 8B are plan views showing a lay-out of patterns of a photoresist mask of two stages for patterning bit lines after the step of FIG. 7B.
Figure 8B:
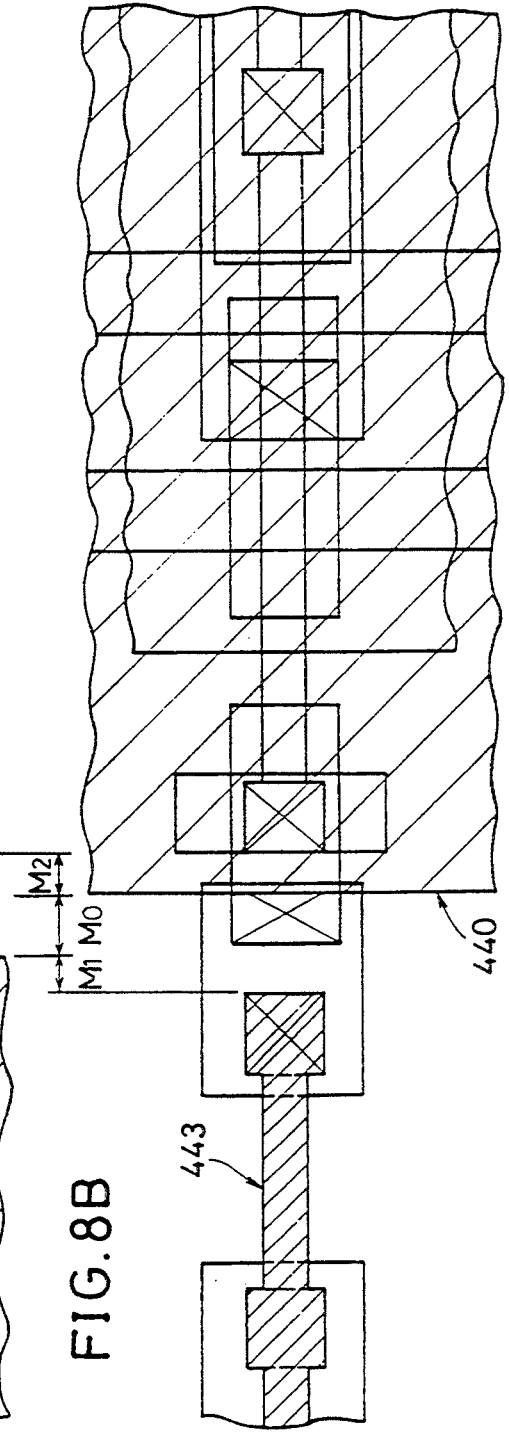

A description will now be made on a photoresist mask for formation of bit lines by photolithography and selective etching, with reference to FIGS. 8A and 8B. FIGS. 8A and 8B are plan views showing a lay-out of the state where photoresist masks for formation of bit lines are patterned in the structure of FIG. 7B. All of photoresist masks 340, 343, 440 and 443 shown in FIGS. 8A and 8B are positive photoresist masks in which photoresists in hatched portions are left. At that time, in order to retain superimposing margins upon exposure in a photolithography processing, it is necessary to obtain distances M0, M1 and M2, shown in FIGS. 8A and 8B, to be not less than approximately 0.15 to 0.2 μm. The actual bit line pattern is a combination of pattern 340 of FIG. 8A and pattern 443 of FIG. 8B. Respective patterns 343 and 440 shown in respective FIGS. 8A and 8B serve to cover the actual bit line pattern upon double exposure in photolithography processing. Photoresist is applied to the formed structure of FIG. 7B. Then, a resultant structure is exposed by using the photoresist masks of FIG. 8A and then exposed by using the photoresist masks of FIG. 8B. The order of the patterns of FIGS. 8A and 8B may be reverse.

Through the above-described two exposure processing steps, respective depths of focus corresponding to respective photoresist mask patterns 340 and 443 in the respective processing steps can be obtained. By a development processing carried out after the end of such exposure processing steps, a desired photoresist pattern is formed, and by selective etching, bit line 40 formed of polycrystalline silicon layer 38 and tungsten silicide layer 39 and bit line 43 formed of polycrystalline silicon layer 41 and tungsten silicide layer 42 shown in FIGS. 1A and 1B are formed.

As has been described heretofore, according to the first embodiment, bit line 43 serving as a first conductive interconnection layer and bit line 40 as a second conductive interconnection layer are formed, respectively in a lower surface and a higher surface of the interlayer insulation film 33 which lower and higher surfaces are on opposite sides of the step-like portion of the interlayer insulation film, and respective separate photoresist patterns undergo photolithography. Accordingly, even if the step-like portion of interlayer insulation film 33 is larger than the depth of focus in photolithography, the photolithography for each of bit lines 43 and 40 can be made within the depth of focus, and hence a highly precise pattern formation in comply with the pattern of photoresist masks can be made.

Figure 9A:
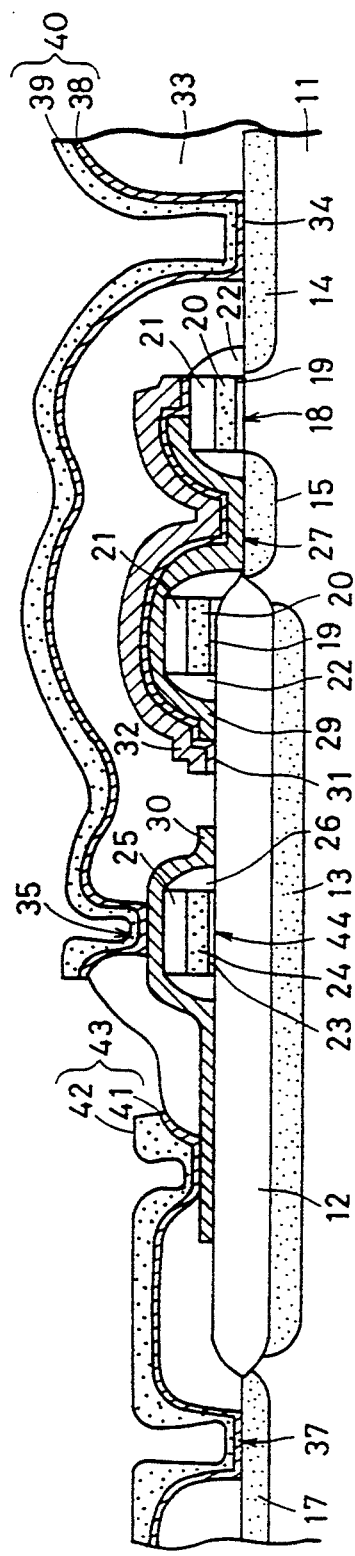
FIG. 9A is a cross-sectional view showing structure of a memory cell of a DRAM according to a second embodiment of the present invention.
Figure 9B:
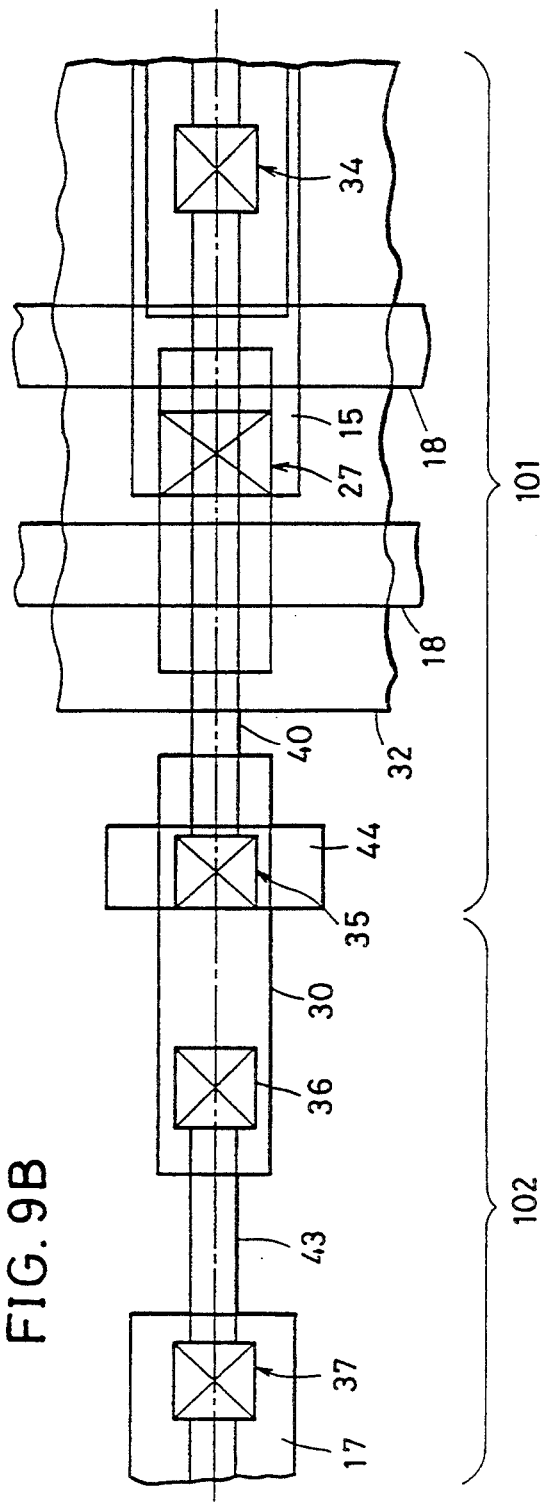
FIG. 9B is a plan view showing a lay-out of FIG. 9A.

A second embodiment of the present invention will now be described with reference to FIGS. 9A and 9B. The second embodiment differs from the first embodiment in that the electrical connection of bit lines 40 and 43 is made only by a conductive polycrystalline silicon layer 30 without provision of a conductive diffusion layer 16 in the second embodiment, whereas it is made by conductive polycrystalline silicon layer 30 formed from the top surface of dummy interconnection 44 to the surface of silicon substrate 11 and by conductive diffusion layer 16.

The second embodiment is effectively applied to a case where bit lines 40 and 43 serving as conductive interconnection layers are formed over the step-like portion of interlayer insulation film 33 located on an isolation region 12. This embodiment has the same effect as that of the first embodiment.

Figure 10A:
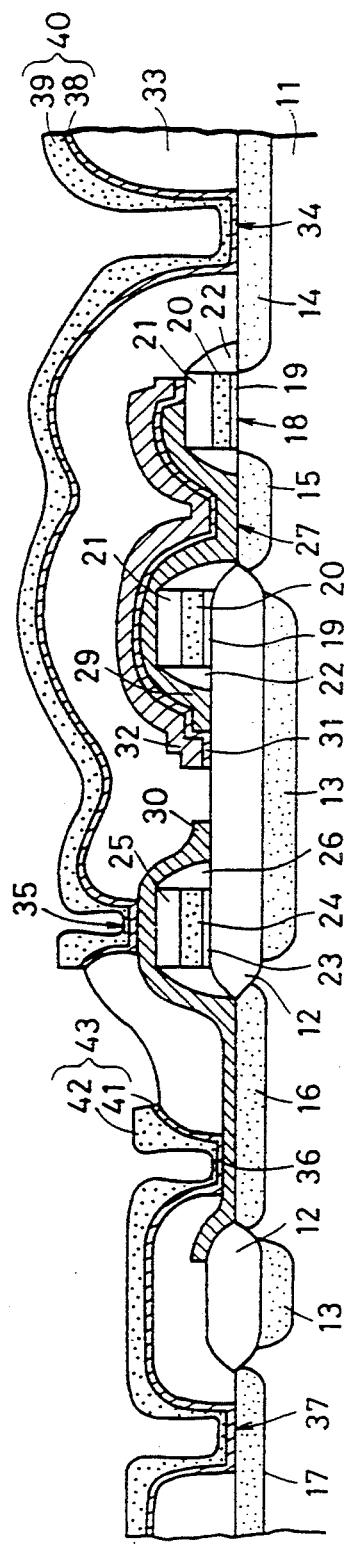
FIG. 10A is a cross-sectional view showing structure of a memory cell of a DRAM according to a third embodiment of the present invention.
Figure 10B:
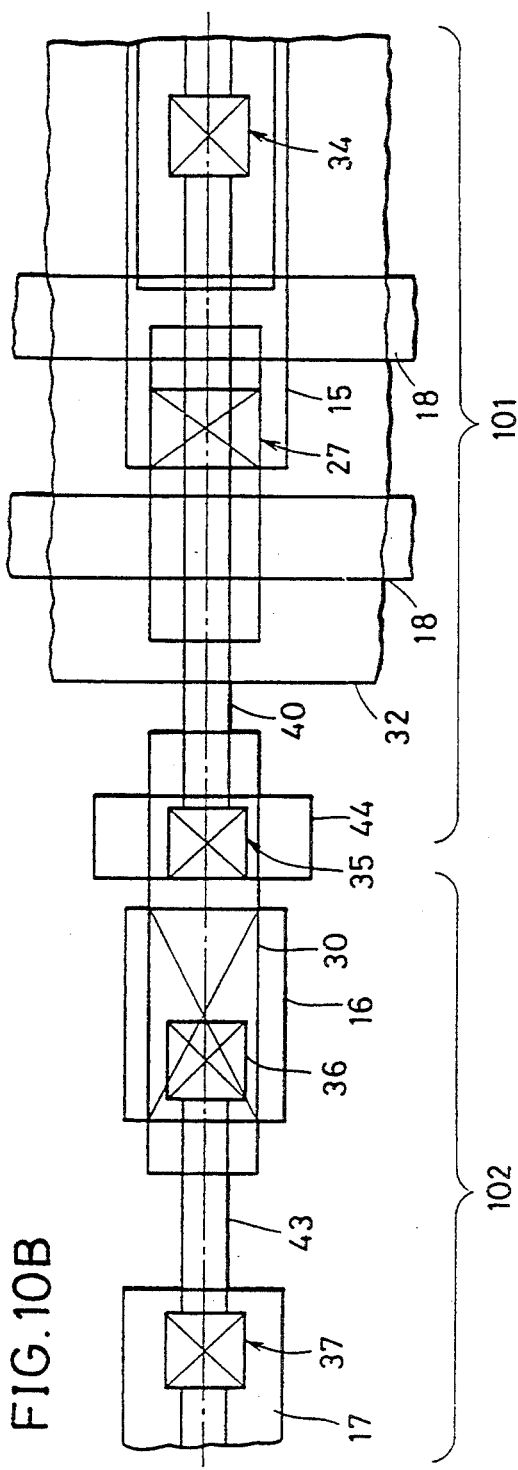
FIG. 10B is a plan view showing a lay-out of FIG. 10A.
Figure 11A:
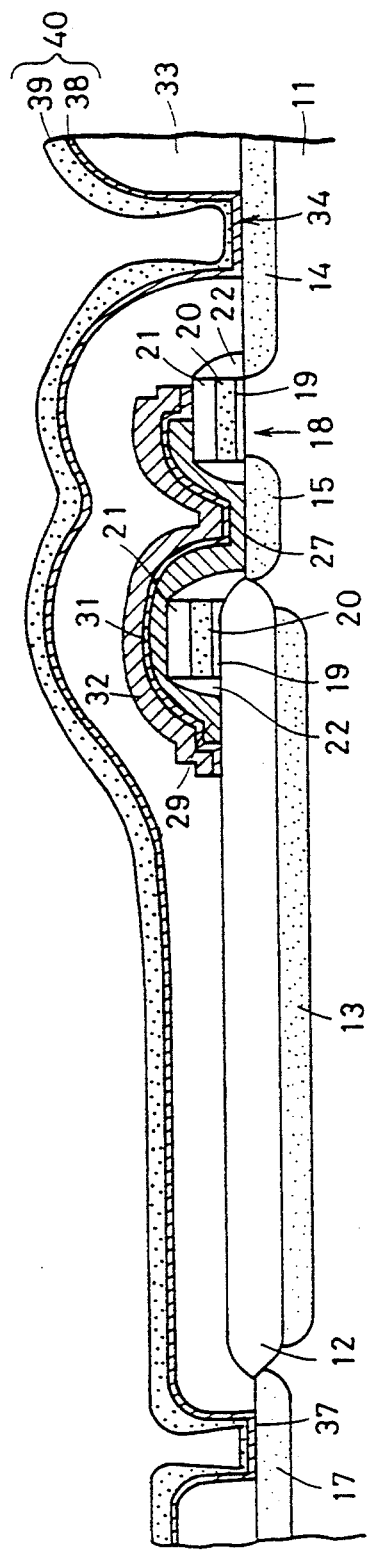
FIG. 11A is a cross-sectional view showing one example of structure of a memory cell of a conventional DRAM.
Figure 11B:
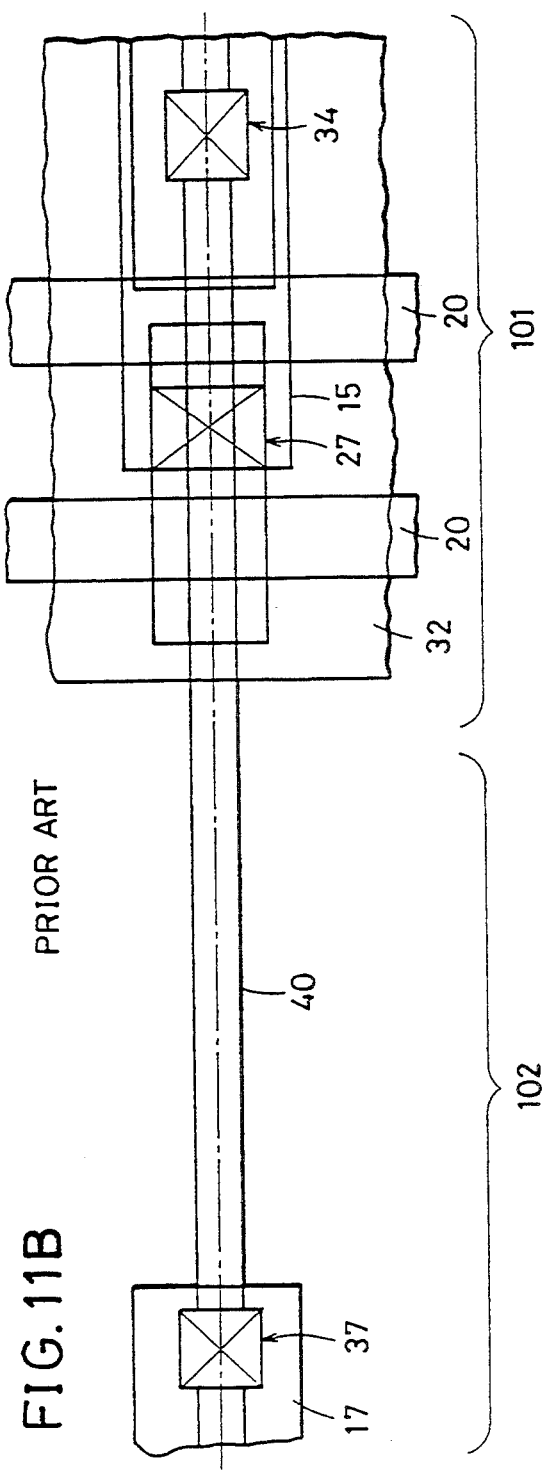
FIG. 11B is a plan view showing a lay-out of FIG. 11A.
Figure 12:
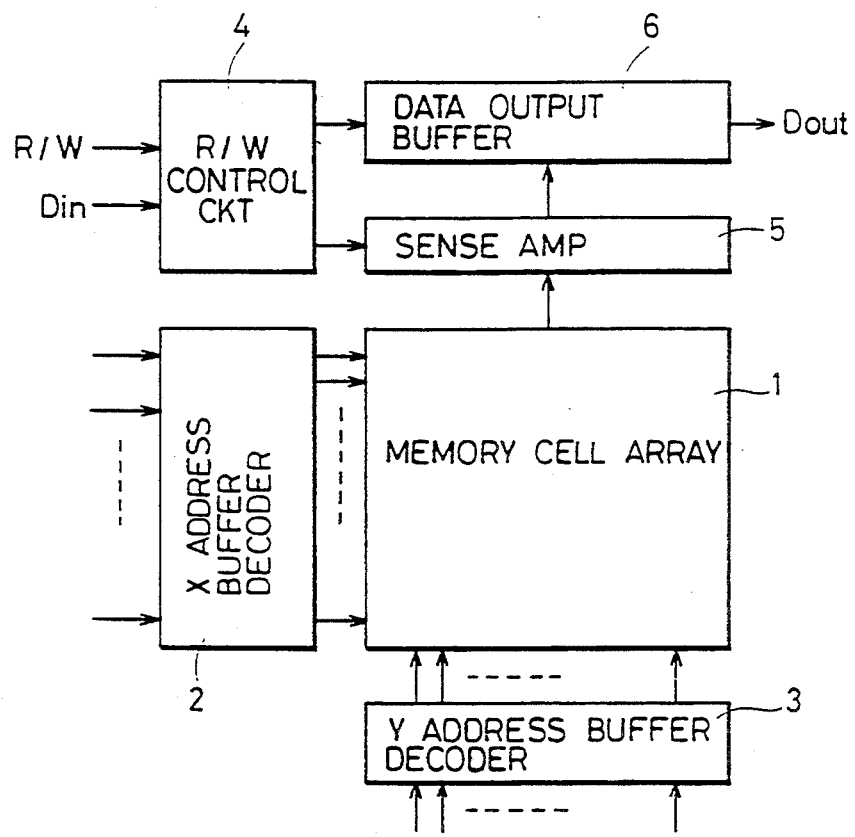
FIG. 12 is a block diagram of a general RAM.
Figure 13:
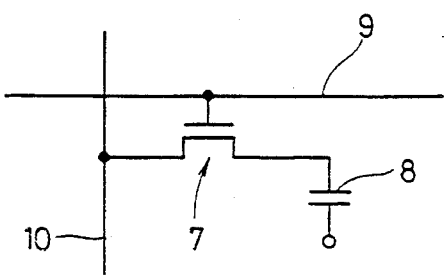
FIG. 13 is an equivalent circuit diagram of a memory cell of a DRAM.

A third embodiment of the present invention will now be described with reference to FIGS. 10A and 10B. The third embodiment differs from the first and second embodiments in that a conductive polycrystalline silicon layer 30 for electrically connecting bit lines 40 and 43 extends also over the surface of a conductive diffusion layer 16 provided in the surface of silicon substrate 11 and that bit line 43 and conductive polycrystalline silicon layer 30 are connected through a contact hole on conductive diffusion layer 16.

According to the third embodiment, contact resistance can be further suppressed as compared to that in the case where conductive diffusion layer 16 and bit line 43 are directly connected.

As has been described heretofore, according to the foregoing respective embodiments, even if a conductive interconnection layer is formed on an interlayer insulation film having a step-like portion larger than depth of focus so that it is formed over the step-like portion, respective conductive interconnection layers of lower and higher surfaces interposing the step-like portion therebetween are patterned by separate photolithography processing steps, so that the respective conductive interconnection layers can be patterned within the depth of focus. Accordingly, conductive interconnection layers of desired patterns are precisely formed without being affected by the step-like portion, and conductive interconnections can be formed without any constriction or the like produced in a multi-layer structure with higher productivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming an interlayer insulation film having a step-like portion on a substrate, wherein said step-like portion is defined by adjacent lower and higher surfaces of said interlayer insulation film;
   depositing a conductive film on said interlayer insulation film; and
   patterning said conductive film and forming a first conductive interconnection layer in said lower surface of said interlayer insulation film and a second conductive interconnection layer in said higher surface of said interlayer insulation film,
   said first and second conductive interconnection layer forming step comprising the steps of:
      forming a first photoresist mask having a pattern covering all regions where said second conductive interconnection layer is to be formed, in addition to the same pattern as the pattern of said first conductive interconnection layer, and using said first photoresist mask as an etching mask, and
      forming a second photoresist mask having a pattern covering all regions where said first conductive interconnection layer is to be formed, in addition to the same pattern as the pattern of said second conductive interconnection layer, and using said second photoresist mask as an etching mask.

2. The method of claim 1, wherein said conductive film forming step comprises the steps of:
   forming a polycrystalline silicon layer,
   forming a tungsten layer on said polycrystalline silicon layer, and
   silicidizing said tungsten layer.

3. The method of claim 1, wherein:
   said photoresist mask having the pattern covering all regions where said second conductive interconnection layer is to be formed in patterning of said first conductive interconnection layer covers up to an outer region of at least 0.15 $\mu$m from the pattern of second conductive interconnection layer, and said photoresist mask 343 having the pattern covering all regions where said first conductive interconnection layer is to be formed in patterning of the second conductive interconnection layer covers up to an outer region of at least 0.15 $\mu$m from the pattern of said first conductive interconnection layer.

4. A method of manufacturing a semiconductor device, comprising the steps of:
   forming a conductive layer in a region on a substrate;
   forming on said substrate an interlayer insulation film having a step-like portion on said region of said conductive layer, wherein said step-like portion is defined by adjacent lower and higher surfaces of said interlayer insulation film;
   forming a pair of contact holes in which a surface of said conductive layer becomes a bottom surface on the contact holes, on both a lower region and a higher region interposing said step-like portion therebetween in a region in the vicinity of said step-like portion of said interlayer insulation film; and
   forming a first conductive interconnection layer and a second conductive interconnection layer, respectively on said lower surface and said higher surface of said interlayer insulation film, including an inner surface of said contact hole pair.

5. The method of claim 4, wherein said conductive layer forming step comprises the step of forming a conductive polycrystalline silicon layer directly on a dummy interconnection having approximately the same height as that of said step-like portion formed on said substrate to extend over said substrate, wherein a contact hole for connecting said second conductive interconnection layer and said conductive layer therein is formed directly on said dummy interconnection.

6. The method of claim 4, wherein said conductive layer forming step comprises the steps of:
   implanting impurities onto the surface of said substrate and forming a conductive diffusive layer, and
   forming a conductive polycrystalline silicon layer connected to the surface of said conductive diffusion layer.

* * * * *